(12) United States Patent
Haag et al.

(10) Patent No.: US 6,337,001 B1
(45) Date of Patent: Jan. 8, 2002

(54) PROCESS FOR SPUTTER COATING, A SPUTTER COATING SOURCE, AND SPUTTER COATING APPARATUS WITH AT LEAST ONE SUCH SOURCE

(75) Inventors: Walter Haag, Grabs; Pius Gruenenfelder, Wangs, both of (CH)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 08/895,451

(22) Filed: Jul. 16, 1997

(30) Foreign Application Priority Data

Jul. 15, 1997 (EP) .......................... 97 112 040

(51) Int. Cl.[7] .......................... C23C 14/34; C23C 14/35
(52) U.S. Cl. .............. 204/192.2; 204/192.12; 204/192.22; 204/298.06; 204/298.07; 204/298.08; 204/298.12; 204/298.18; 204/298.21
(58) Field of Search ............ 204/192.12, 298.06, 204/298.07, 298.16, 192.2, 192.22, 298.14, 298.12, 298.18, 298.21, 298.26, 298.08

(56) References Cited

U.S. PATENT DOCUMENTS

| | | | |
|---|---|---|---|
| 3,830,721 A | 8/1974 | Gruen et al. | 204/298.07 |
| 3,922,214 A | 11/1975 | Van Cakenberghe | 204/298.41 |
| 3,985,635 A * | 10/1976 | Adam et al. | 204/298 |
| 4,094,764 A | 6/1978 | Boucher et al. | 204/298.06 |
| 4,401,546 A * | 8/1983 | Nakamura et al. | 204/298 |
| 4,412,907 A * | 11/1983 | Ito et al. | 204/298 |
| 4,595,482 A * | 6/1986 | Mintz | 204/298 |
| 5,069,770 A * | 12/1991 | Glocker | 204/192.12 |
| 5,423,970 A * | 6/1995 | Kugler | 204/298.03 |
| 5,437,778 A * | 8/1995 | Hedgcoth | 204/298.21 |
| 5,494,699 A * | 2/1996 | Chung | 427/66 |
| 5,507,930 A * | 4/1996 | Yamashita et al. | 204/192.15 |
| 5,643,394 A * | 7/1997 | Maydan et al. | 156/345 |
| 5,798,029 A * | 8/1998 | Morita | 204/298.16 |

FOREIGN PATENT DOCUMENTS

| | | | |
|---|---|---|---|
| DE | 44 22 472 A1 | 1/1996 | |
| JP | 64-75669 | * 9/1987 | 204/298 |
| JP | 63-174120 | 7/1988 | |
| JP | 2-225663 | * 2/1989 | 204/298 |
| JP | 3-183760 | 8/1991 | |
| JP | 5-230640 | * 9/1993 | 204/298 |
| JP | 5-320891 | * 12/1993 | 204/298 |

* cited by examiner

*Primary Examiner*—Stephen Kalafut
*Assistant Examiner*—Julian A. Mercado
(74) *Attorney, Agent, or Firm*—Crowell & Moring LLP

(57) ABSTRACT

Two mutually opposite sputtering surfaces of at least one target are self-enclosed such that a closed loop gap, and consequently a closed loop plasma discharge space, is formed. A gas flow is created between the sputtering surface and directed against workpieces. No gap ends exist on the closed loop gap so that electrons that move along and within the plasma loop can recirculate until most of their energy has been transferred through impacts to the gas particles.

46 Claims, 6 Drawing Sheets

Figure 1:
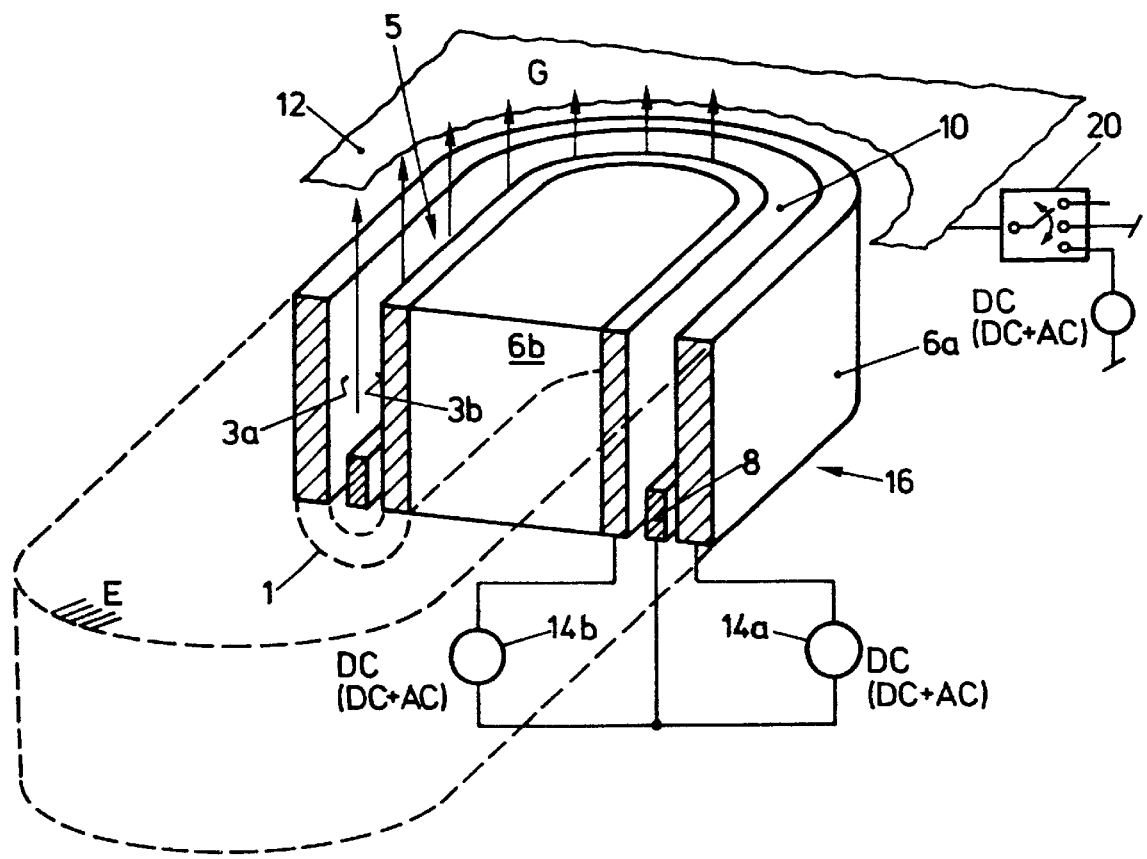

PROCESS FOR SPUTTER COATING, A SPUTTER COATING SOURCE, AND SPUTTER COATING APPARATUS WITH AT LEAST ONE SUCH SOURCE

The present invention relates to a process for sputter coating workpieces in which two sputtering surfaces arranged opposite to each other are mutually sputtered and create between the sputtering surfaces a gas flow that is directed against at least one workpiece. Further, the present invention relates to a sputtering source with two opposite sputtering surfaces, an anode arrangement provided between these sputtering surfaces and a gas exit arrangement effective in a gap defined between the sputtering surfaces, in accordance with the generic terms of claims 1 and 15. Further, the present invention relates to a sputter coating system with a source of said type, as well as the utilization of the process according to this invention, the source according to this invention, and the system according to this invention.

From U.S. Pat. No. 4,094,764 it is known that for sputtering coating a workpiece a gas flow is created across the sputtering surfaces in order to drive the flowing inert or noble gas containing sputtered target material toward the workpiece. In comparison with conventional, cathodic sputtering a much higher coating rate is said to be achievable.

A similar approach is taken according to DE-PS 42 10 125 in which a gas flow is created not across the sputtering surfaces of a flat target according to U.S. Pat. No. 4,094,764 but along the inside surface of a cone-shaped hollow target—a hollow-cathode target—and where the material sputtered off the target is directed toward the substrate workpiece by the flow.

In H. Koch et al. "Hollow cathode discharge sputtering device for uniform large area thin film deposition", J. Vac. Sci. Technol. A9(4), July/August 1991, the advantages of such hollow cathode sputtering are discussed, in particular with respect to the exploitation of the electrons for ionizing the gas contained within the reaction volume. The proposal in this article is to provide a transverse slot in a target block and to direct a gas to flow through this slot toward the workpiece.

At the slot, two sputtering surfaces of the target are closely opposite each other which minimizes the unwanted deposition on system components other than the targets.

This is particularly significant in conjunction with reactive DC sputtering in which electrically isolating reaction products are created and re-deposited.

However, this approach has the following disadvantages:

To minimize the coating of opposite sputtering surfaces by reacted target material and to maximize the electron impact efficiency for the ionization, the selected gap width and consequently the distance between the two sputtering surfaces must be kept small. However, the design of the gap with closely opposite target surfaces requires correspondingly short gap width surfaces or termination surfaces. This in turn is highly disadvantageous with respect to the electron impact yield in that the electrons are reflected in the end zones of the slot and are ultimately are dissipated via the anode, partially before they have fully released their energy through momentum transfer to the gas particles. When a hollow-slot cathode of the type described in said journal article is used, the basic problem is that the better the target coating problem is solved along the sputtering surfaces, that is, the narrower the slot the greater the loss in electron impact yield in the end zones of the slot. As a rule there is an electron drift in the longitudinal direction of the slot, preferably toward the end of the slot, which leads to uneven longitudinal plasma distribution and consequently uneven sputter distribution.

The objective of the present invention is to solve the aforementioned problems. Based on processes of the aforementioned type this is achieved by making each of the mutually opposite sputtering surfaces closed in themselves, and by creating a gas flow through one of the self-enclosed gaps essentially transversely to the sectional planes in which the gap appears as closed in itself, thus resulting in a closed plasma loop.

As the gap is closed in itself, implemented by two mutually opposite sputtering surfaces that are closed in themselves, for example an inside cylinder target and an outside cylinder hollow target, the result is that the gap width can be designed within broad limits and in particular be short in order to avoid the aforementioned re-deposition problems. But due to the sputtering surfaces that are closed in themselves, even if they feature corners such as when cuboid targets are used, no gap ends exist on the closed loop gap which means that the electrons that move along and within the plasma loop can recirculate therein until they have transferred most of their energy through impacts to the gas particles which leads to a more efficient plasma discharge. This is evidenced by the lower discharge voltages and the more stable operation.

If, as preferably proposed, each self-enclosed sputtering surface is formed on a separate target, this also results in a preferred stable arrangement. To achieve optimum power balance or for producing mixed materials from different target materials, each of these targets can also be fed by a separate generator arrangement.

Due to the high plasma density in the closed loop gap it is possible to further minimize the re-deposition problem on sputtering surfaces, in particular with electrically isolating reaction products, which makes the proposed solution highly suitable for coating with dielectric materials and in particular oxides. In a preferred design at least a portion of the gas is, therefore, chosen as a reactive gas, preferably $O_2$, where good gas separation is ensured if the inert gas, e.g. Ar, is admitted into the gap and the reactive gas, away from the target, is admitted into the chamber.

Reactive gas is admitted with great preference not through the gap but directly into the coating chamber.

In a particularly preferred design, coating is performed with a material containing at least one ferromagnetic component, or with a dielectric material, where both coating materials are known to be highly critical for the DC sputtering process preferred here. In another preferred design deposition takes place with MgO or ITO, be it through reactive sputtering of metallic targets or possibly through additional reactive sputtering of oxidic targets, that is, in particular as in the case of MgO, materials which on account of their low conductance are highly problematic for DC sputtering.

With the procedure according to the invention and based on the fact that the two mutually opposite sputtering surfaces can be implemented on one target each, it becomes possible to use different target materials for the two sputtering surfaces which means that more complex coating materials can be deposited, in particular through reactive sputtering.

In a particularly preferred design a magnetic field is created inside the gap, preferably in the form of a magnetron field, by creating at least one magnetic field with a tunnel-shaped field pattern on at least one sputtering surface, preferably along both sputtering surfaces, where the axes of the tunnel run along the self-enclosed sputtering surfaces and preferably are also closed in themselves.

In comparison with slotted targets described in the aforementioned journal article, a significant increase in the plasma density is achieved by means of the self-enclosed, closed loop gap according to the invention, and the plasma density is further increased by means of said magnetic fields. One of the reasons for this is the increasingly improving electron impact yield (continuously closed loop electron traps).

Although it would be possible to operate the target(s) according to the invention with AC, the distinctly preferred implementation version is to use DC, particularly for cost reasons, possibly as in pulsed mode, with superposed AC in order to achieve particularly high operation stability.

A sputter coating source that solves the aforementioned task is characteristically designed in such a way that each of the sputtering surfaces form surfaces that are closed in themselves, where the gap forms a self-enclosed gap that is open on at least one side, and the gas exit arrangement of the gap opening is located on the opposite side.

A sputter coating system according to the invention features at least one sputtering source of said type as well as a DC generator for the configured targets of which there is at least one, preferably two, and possibly a generator arrangement for outputting a DC signal with superposed AC signal but preferably a pulsed DC signal.

The process according to the invention, the source according to the invention, as well as the system according to the invention are particularly suitable for sputter coating with ferromagnetic materials or dielectric materials, in particular for depositing MgO or ITO coatings, or for coating plasma display panels where large surfaces have to be coated economically.

In this case the substrates can be transported e.g. across the linear source arrangement. It is also possible to arrange several linear sources in intervals suitable for distribution in such a way that the overall coating rate can be increased or large surfaces can be statically coated.

The preferred design versions of the process according to the invention are specified in claims 2 to 14, the source according to the invention is specified in claims 16 to 23, and the system according to the invention is specified in claims 24 and 25.

Particularly preferred applications of the invention are specified in claims 26 to 28.

Figure 2:
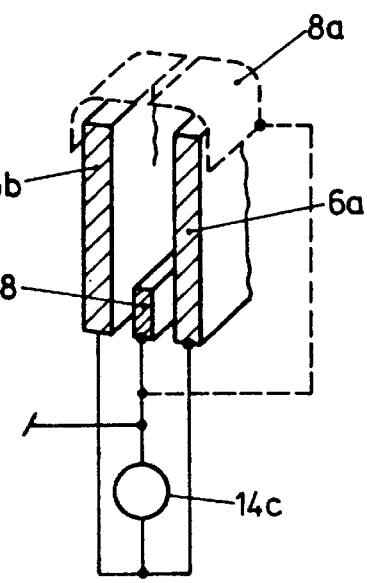
Figure 3:
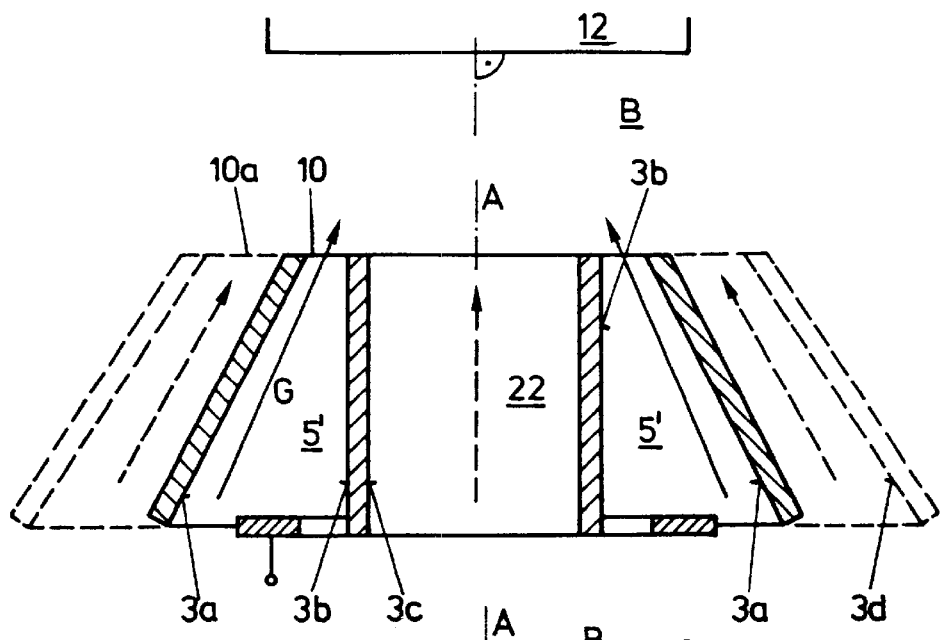
Figure 9:
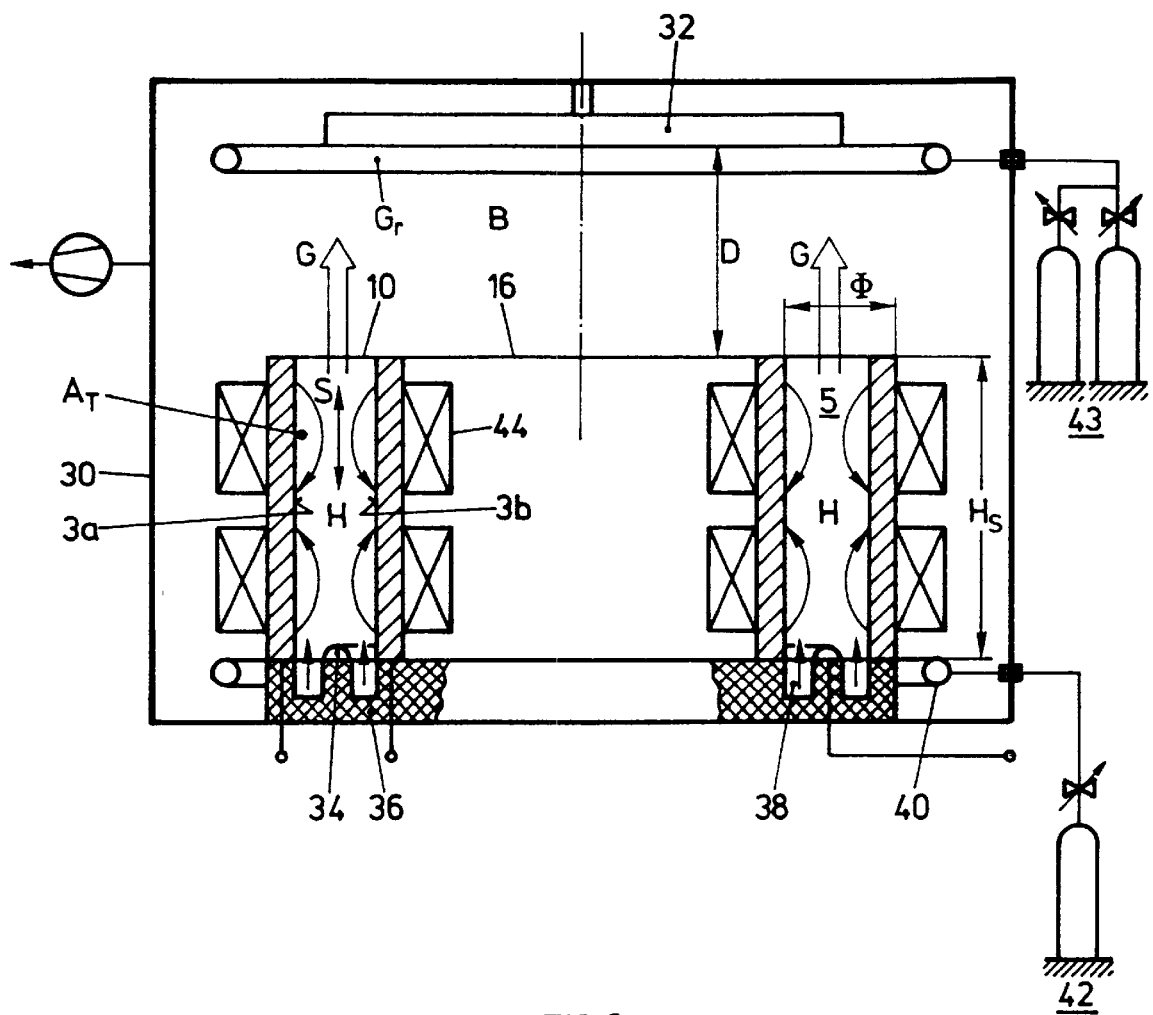
Figure 10:
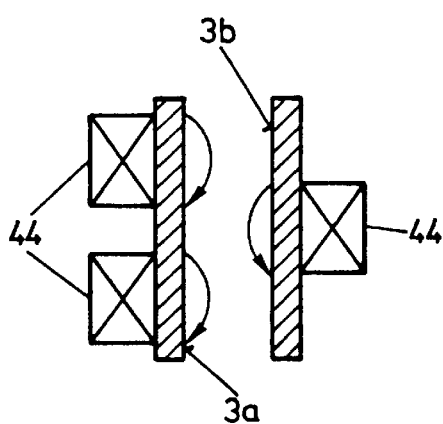
Figure 11:
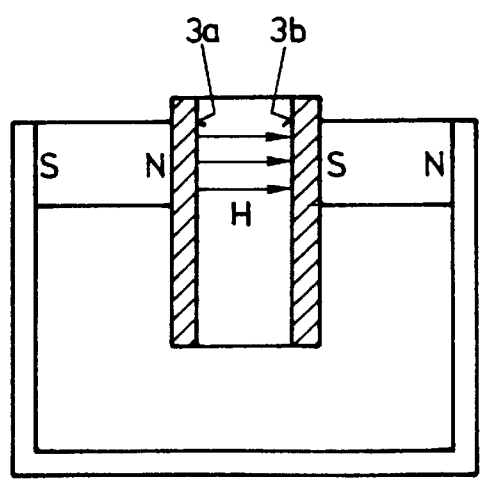
Figure 12:
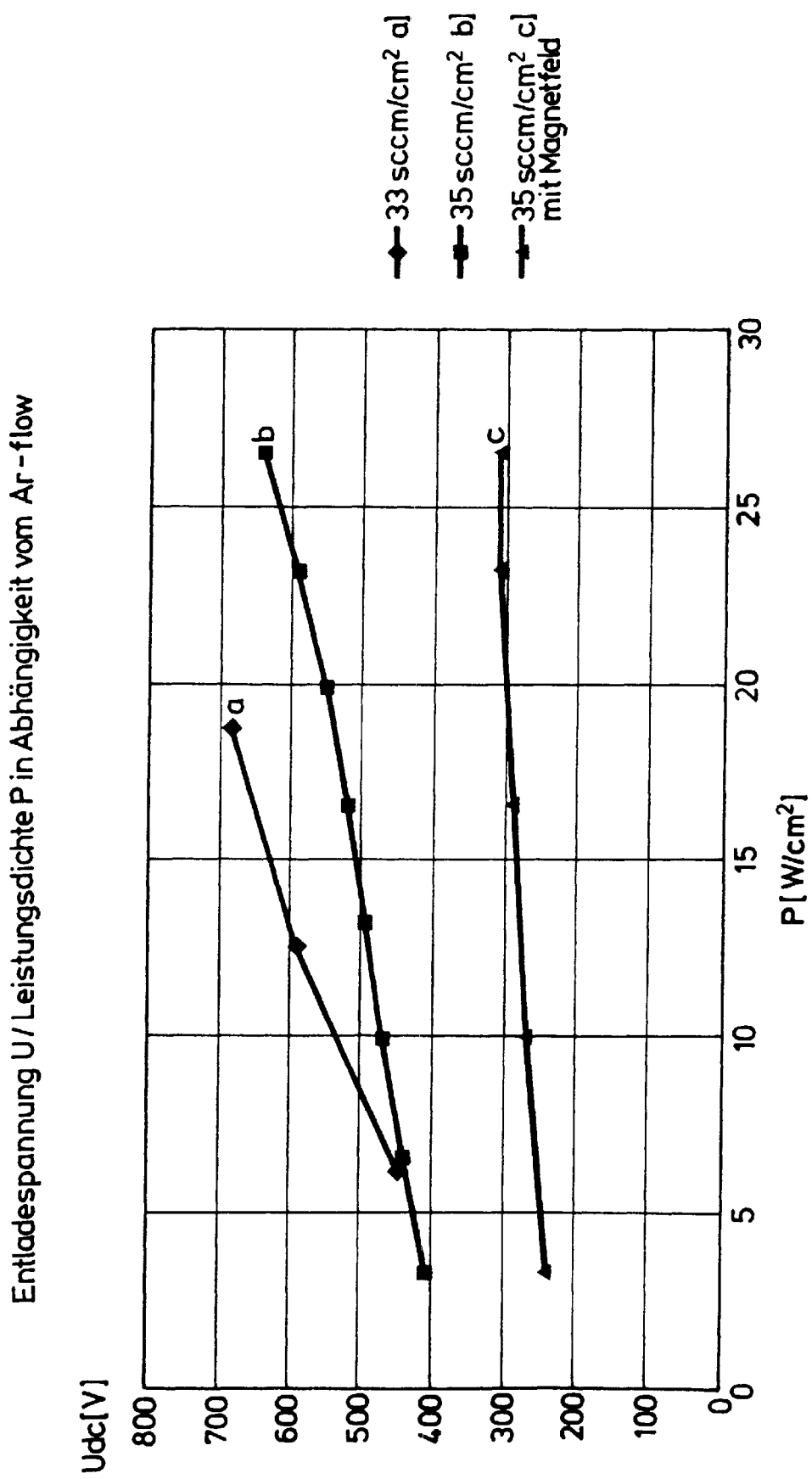
Figure 13:
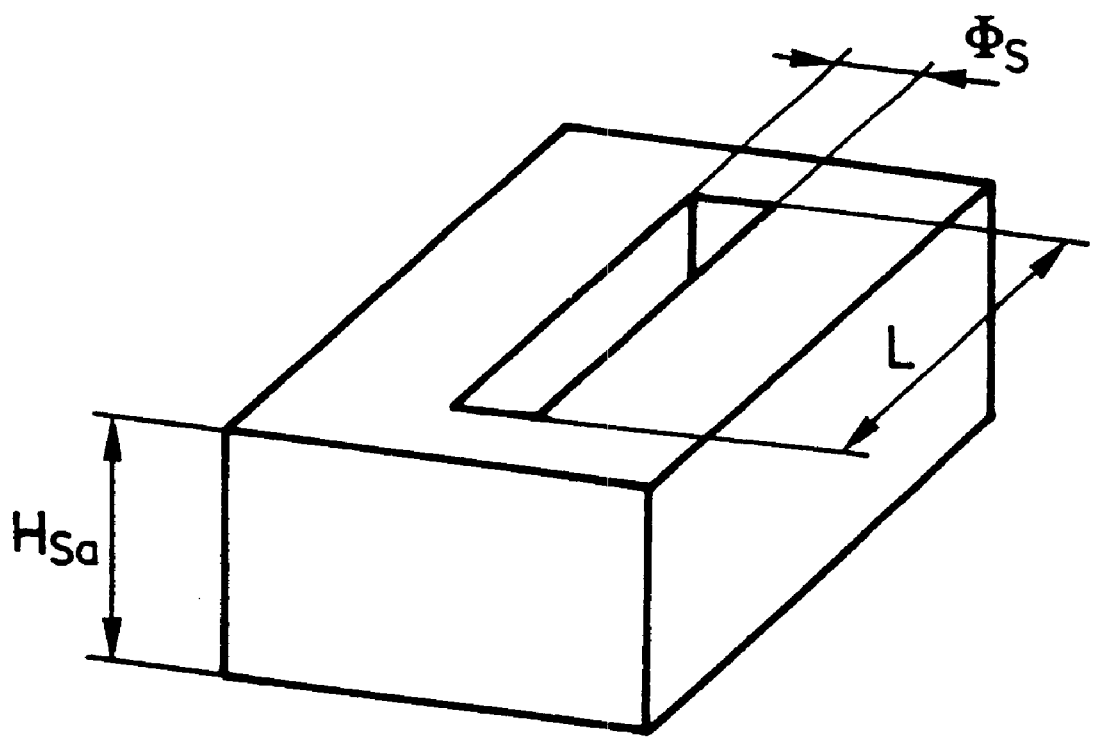

The invention is subsequently explained by illustrations which serve as examples. These show:

FIG. 1: Perspective and schematic cross-section through a sputtering source according to the invention and working in accordance with the process of this invention;

FIG. 2: Based on diagram FIG. 1 an additional version for electrical feeding of said sputtering source;

FIG. 3: Schematic cross-section of another sputtering surface arrangement based on the process according to the invention or a source or system according to the invention;

FIGS. 4 to 8: Additional perspective diagrams showing arrangements of sputtering surfaces or targets used in the process according to the invention;

FIG. 9: Schematic diagram of a sputtering source according to the invention that works according to the process and is used on a system according to the invention, in conjunction with a basically preferred magnetic field;

FIG. 10: Based on the diagram in FIG. 9 another design of the preferred magnetic field;

FIG. 11: Another design of a preferably used magnetic field;

FIG. 12: DC plasma discharge voltage plotted across the power per unit of sputtering area, based on the (a) current state of the art (b) process according to the invention but without magnetic field (c) process according to the invention, with magnetic field, and FIG. 13: A slotted target in the traditional design with definition of its geometric dimensions.

The basic process shall be explained based on FIG. 1.

Two self-enclosed sputtering surfaces 3a and 3b are designed in such a way that between themselves they define a closed loop, self-enclosed gap 5 that is open on one side along a closed loop opening 10. As shown by the dashed line at 1, sputtering surfaces 3a and 3b can be created by machining gap 5 into a single target block, but sputtering surfaces 3a and 3b are preferably sputtering surfaces of one target each, that is, an external target 6a and a circular or essentially rod shaped target 6b.

At one end zone of gap 5 an anode arrangement 8 is provided which, as illustrated, can comprise a common anode for both targets 6a and 6b, or alternatively two separately powered anode rings. The anode can also advantageously be positioned on the exit side (10) and simultaneously encircle the cathode from the outside with darkspace clearance, or it may also be installed in an isolated fashion. It may at the same time be designed as a slot orifice. Anodes are preferably operated with connection to ground. Bias feeding for controlling the particle energy is also possible. Such an anode arrangement is shown with dashed lines in FIG. 2.

A gas flow G along gap 5 is generated, essentially transversely to the sectional plane, for example E, where gap 5 appears as a closed loop. Through the gas flow G coating material particles are transported from gap 5 through the gap opening 10 toward one or several workpieces 12 where they are gently deposited. In reactive sputtering processes the reactive gas is admitted only there.

One target, or as illustrated both targets 6a, 6b that define sputtering surfaces 3a and 3b, are preferably fed individually with DC or possibly with DC and superposed AC by a separate generator 14a and 14b, respectively. Alternatively they are fed by a common generator 14c, as shown in FIG. 2.

In a vacuum chamber of the sputtering system according to the invention comprising the aforementioned source 16, the workpiece 12 or a workpiece holder (not shown) used in conjunction with a system according to the invention is held at floating potential or on reference potential such as ground, or on a bias potential, preferably DC potential, or a DC potential with superposed AC potential, as shown schematically in FIG. 1 with selector switch 20.

FIG. 3 is a cross-sectional diagram showing another arrangement of sputtering surfaces 3a and 3b according to FIG. 1. In this case gap 5' narrows toward gas exit opening 10 which has the effect that similar to pressure stages an accelerated gas flow G toward workpiece 12 is achieved. As shown by the dashed lines in FIG. 3 the principle of the present invention illustrated in FIG. 1 can be extended that also the internal space 22, possibly with an additional sputtering surface 3c, can be effectively used as a hollow cathode for sputtering and/or by providing additional sputtering surfaces 3d and corresponding closed loop gaps 10a, an increasingly complex but space-saving source according to the invention can be implemented.

Without showing additional details except the arrangement of the sputtering surfaces and, in accordance with the one or two (maximum configuration) targets, FIGS. 4 to 8 show different design versions of the closed loop gap 10 and consequently the closed sputtering surfaces 3a and 3b that define the gap.

Figure 4:
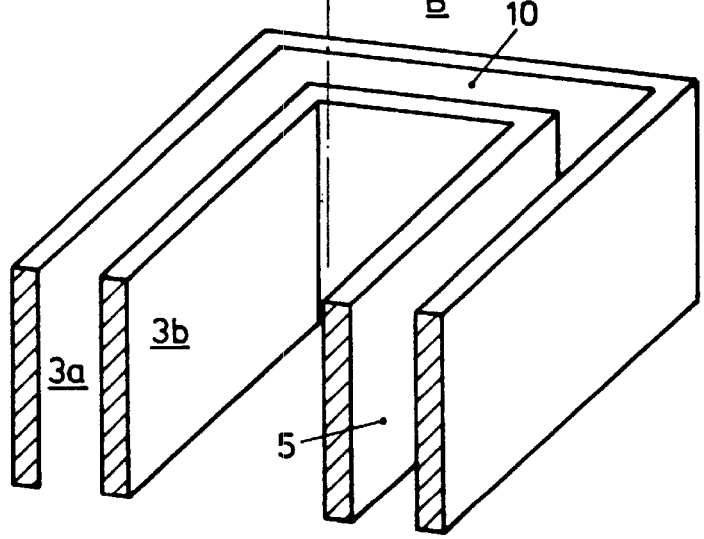
Figure 5:
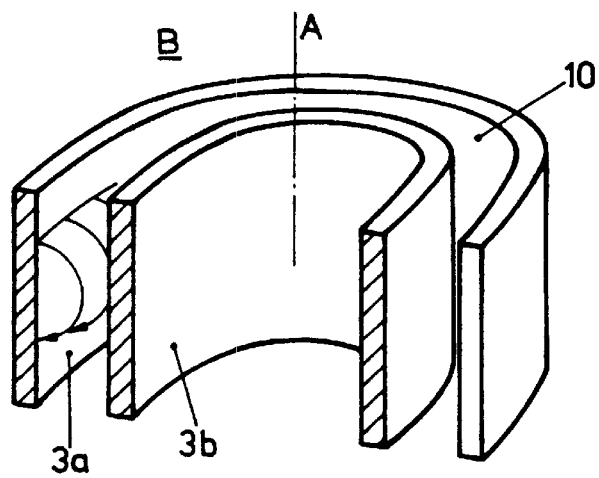

FIG. 4 shows a top view of the closed loop gap 10 which has a rectangular frame shape or, in FIG. 5, an annular or elliptical shape where the sputtering surfaces defining the gap in FIGS. 4 and 5 are parallel to the central axis A and equidistant. The sputtering surfaces according to FIG. 4 or 5 span cuboidal surfaces or cylindrical surfaces or cylinder-like surfaces 3a, 3b.

Figure 6:
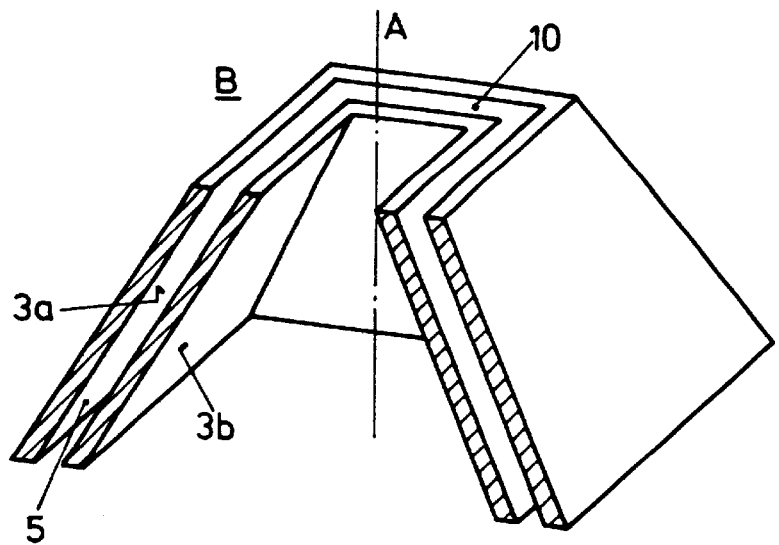
Figure 7:
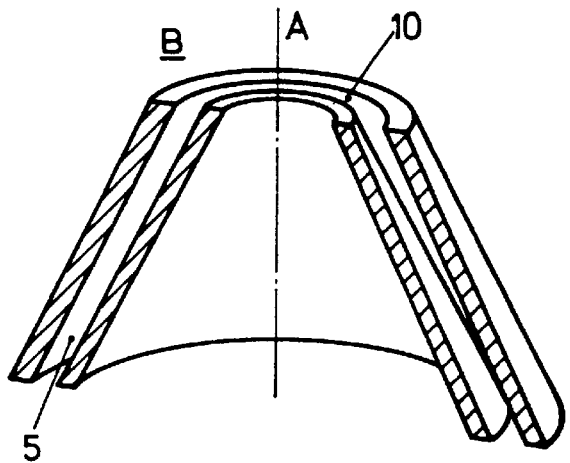
Figure 8:
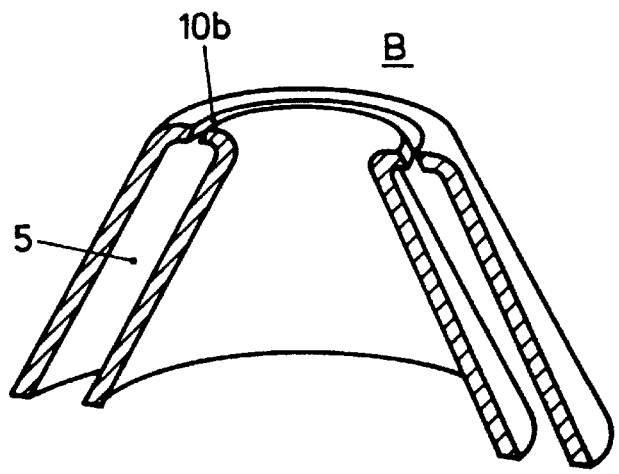

In the arrangement according to FIG. 6 sputtering surfaces 3a, 3b span pyramidal frustum surfaces, according to FIG. 7 essentially circular cone or ellipsoidal cone surfaces. As shown in FIGS. 6, 7 and 8 the gas flow cross-section of the gap narrows toward opening 10, despite equidistant sputtering surfaces, and this is even more pronounced in the design according to FIG. 3. This results in an increasingly intensive contact of the gas flow with the sputtering surfaces as well as a gas flow acceleration toward the workpiece. As mentioned with respect to FIG. 3 this effect can be amplified in all design versions illustrated in FIGS. 4 to 8 by gradually narrowing the distance between sputtering surfaces toward the exit opening 10, rather than to make them equidistant. The design version according to FIG. 8 which is based on the one shown in FIG. 7, exemplifies how in all design versions a distinct pressure stage between gap 5 and the workpiece coating space B can be implemented, with corresponding increase in the gas flow velocity toward workpiece 12 as illustrated in FIG. 3.

Based on FIGS. 1 to 8 it undoubtedly becomes clear to the professional how the sputtering surfaces are to be designed and arranged in accordance with the principles of the invention, and this consequently provides him with additional possibilities of saving gas or even better separation of inert gas and reactive gas.

FIG. 9 is a cross-sectional diagram of a system according to the invention with a sputtering source according to the invention operating according to the process that is the subject of this invention, based on which additional, highly preferred measures shall be described which, of course, can also be implemented on all previously described design versions of the invention.

According to FIG. 9 a source 16 according to the invention is installed in one of the systems according to the invention. This source is located opposite a schematically represented workpiece holder 32. It can be designed in accordance with one of the versions illustrated in FIGS. 1 to 8. The gap area of gap 5 located opposite the gas exit opening 10 is closed and supports a closed loop anode ring 34. At the gap termination 36 there is a gas distribution space 38 which, for example, is fed by a closed loop ring line 40 from a gas tank arrangement 42 which contains preferably an inert gas such as a noble gas, for example, Ar.

Additionally, and as a variant that is preferred in all design versions illustrated in FIGS. 1 to 8, a magnetic field H is generated in gap 5. Permanent and/or electromagnet arrangements 44 are used that generate the highly preferred, tunnel-shaped H field lines that enter and emerge on at least one, or as illustrated on both sputtering surfaces 3a and 3b, where the tunnel axes which are preferably closed in themselves, as shown at $A_T$ in FIG. 9, also encircle the sputtering surfaces which are preferably closed in themselves.

FIG. 10 shows a different arrangement of the tunnel-shaped magnetic fields together with the magnet arrangement 44 from which the professional can readily see that, depending on the gap geometry and desired effect the preferably used tunnel fields can be implemented on the two sputtering surfaces in a different manner, for example, locally staggered, as shown in FIG. 10. Particularly suited to ferromagnetic targets are also homogenous fields from target to target which, for example, can be created with the yoke arrangement shown in FIG. 11; also feasible are mixed homogenous and inhomogenous fields.

The process, the source or the system according to the invention are particularly suitable for sputter coating workpieces with materials that have at least a ferromagnetic content, or with dielectric materials. At least one but preferably both sputtering surfaces and the corresponding targets should preferably be made of a ferromagnetic material or a dielectric material if the latter is not formed and deposited by a reactive process. In particular for depositing dielectric coatings and in addition to or instead of using dielectric targets, the gas $G_r$ or at least one component of this gas will consist of a reactive gas from tank arrangement 43 in addition to the inert gas G from tank arrangement 42. For example, and in the especially preferred application, an MgO layer can be deposited, be it by sputtering from MgO targets possibly with subsequent post-oxidation in a gas $G_r$ containing $O_2$, or by sputtering from metallic Mg targets and reaction with the gas $G_r$ containing $O_2$. Especially when the source is designed as a circular source it is possible to sputter coat substrate discs such as memory discs of all known types, where the invention used in a linear design is particularly suitable for producing PDP, so-called plasma display panels.

For operating a source according to the invention the following parameters are recommended:

Total pressure in coating chamber B: 0.1 to 10 mbar

For reactive sputtering of oxides:

Partial pressure $O_2$: up to 10% of the total pressure in the coating chamber B with admission of $O_2$ ($G_r$) in chamber B.

Exit flow of the gas from opening 10 into coating chamber B:

The Ar gas flow G in the gap is implemented in the Knudsen or viscous range, according to the formulas Knudsen range:

$$10^{-2} \text{ mbar cm} \leq p \cdot \Phi \leq 0.6 \text{ mbar cm}$$

Viscous range:

$$0.6 \text{ mbar cm} \leq p \cdot \Phi$$

where p is the total pressure in the gap and $\Phi$ (see FIG. 9) the gap width.

The gas flow is preferably selected within the Knudsen range. In addition the following formula preferably applies:

$$10 \text{ sccm/cm}^2 \leq F \leq 200 \text{ sccm/cm}^2,$$

where F is the working flow and possibly reactive flow per unit of gap opening area, preferably 10 sccm/cm$^2 \leq F \leq 50$ sccm/cm$^2$.

Gap width or target distance $\Phi$ (see FIG. 9):

$$5 \text{ mm} \leq \Phi \leq 40 \text{ mm},$$

preferably $\Phi \leq 25$ mm
preferably 8 mm $\leq \Phi \leq 20$ mm.

Gap height $H_s$ (see FIG. 9):

$$1 \text{ cm} \leq H_s \leq 20 \text{ cm}.$$

Magnetic field: Measured parallel to the sputtering surfaces in the center of gap 5:

$$150 \text{ Gauss} \leq H \leq 1200 \text{ Gauss},$$

preferably H $\geq$ 300 Gauss,
preferably 300 Gauss $\leq$ H $\leq$ 800 Gauss.

A system according to the invention with circular source, essentially designed as shown in FIG. 9, has the following dimensions and was operated as follows:

| | |
|---|---|
| Distance opening plane to substrate (D, FIG. 9): | 40 mm |
| Total target area: | 301.4 cm$^2$ |
| Gap height H$_S$: | 40 mm |
| Gap width Φ: | 30 mm |
| Exit area 10: | 113 cm$^2$ |
| Mean gap diameter: | 120 mm |
| Gap length | 377 mm |
| Argon flow | 2825 sccm |
| Pressure in coating chamber B: | 0.6 mbar |
| Power: | 9 kW |
| Power per unit of target area: | 29.9 W/cm$^2$ |
| Argon flow per unit of exit area: | 25 sccm/cm$^2$ |
| Field intensity H, parallel to sputtering surface on target: | 300 Gauss | parallel to sputtering surface on target: 300 Gauss

Result

| | |
|---|---|
| Al coating rate: | 16 Å kWs |
| Fe coating rate (Mg target) with O$_2$ content in B approx. 2%) | 18 Å kWs |

The coating rate can be raised by a factor of 2 to 3 by increasing the gas flow.

FIG. 12 shows the discharge power P as a function of the DC burning voltage U.

(a) shows the characteristics of an slotted Al target according to the aforementioned journal article H. Koch et al, where the following slot dimensions apply (see FIG. 12):

| | |
|---|---|
| Slot length L: | 10 cm |
| Slot width Φ$_S$: | 30 mm |
| Slot height H$_{Sa}$: | 40 mm |
| Air Flow: | |
| Gas flow into the coating chamber per unit of slot area: | 33 sccm/cm$^2$ |
| Total pressure in coating chamber B: | 0.6 mbar |

(b): Operation and dimensioning of the system according to the invention as specified above, but without magnetic field H and with an argon flow G per unit of opening area of 35 sccm/cm$^2$.

(c) On the system operated as described under (b) a single, tunnel-shaped magnetic field was subsequently created in gap 10 of each target. In the middle of the target where the field runs parallel to the target, a field intensity of 300 Gauss was measured on the target surface.

As can be seen from FIG. 11 the burning voltage required for the necessary power decreases drastically relative to the known slot target (a) when compared with an arrangement according to the invention without magnetic field according to (b), and even more so when compared with arrangement (c) that includes a magnetic field. This demonstrates the strong effect produced by the fact that the corresponding sputtering surfaces are closed in themselves. It also shows how in magnetic field sputtering according to (c) the characteristic curve asymptomatically approaches a limit which is typical for a magnetron characteristic curve, whereas according to (a) and (b) they increase exponentially which is typical for cathode sputtering without magnetron field. As mentioned, low burning voltages are essential for high quality dielectric coatings, such as MgO.

For producing the gas flow G, it is necessary to work with high pressures that are unusual for cathodic sputtering.

What is claimed is:

1. Process for sputtering coating workpieces, comprising: defining a gap closed in itself between two mutually opposite surfaces of a target arrangement, said surfaces being closed in themselves; generating a plasma in said gap; flowing gas along and out of said gap in a direction essentially transverse to a sectional plane in which the gap appears as closed in itself, thereby sputtering off material from said two mutually opposite surfaces; and transporting such sputtered off material by said gas flowing towards a workpiece.

2. The process of claim 1, further comprising the step of sputter coating said workpiece predominately by sputtered off material sputtered off said mutually opposite surfaces.

3. The process according to claim 2, further comprising the step of connecting both of said two mutually opposite surfaces to electric DC potential.

4. The process according to claim 1, wherein the mutually opposite surfaces are selected of separate targets.

5. The process according to claim 1, wherein a noble gas component is used for causing the gas flow, and a reactive gas is admissible outside said gap.

6. The process according to claim 1, wherein one of a metal and a metal alloy is sputtered off at least one of said mutually opposite surface.

7. The process according to claim 1, wherein sputter coating is performed with a material containing at least one ferromagnetic component, or with dielectric material.

8. The process according to claim 1, wherein sputter coating is performed with MgO or ITO by reactive sputtering of said mutually opposite surfaces being metallic surfaces or by reactive sputtering of said surfaces.

9. The process according to claim 1, wherein different or identical materials are sputtered off said mutually opposite surfaces.

10. The process according to claim 1, wherein in said gap, a magnetic field is formed by a field on at least one of said mutually opposite surfaces having a tunnel-shaped field pattern with the tunnel axis transverse to the gas flow direction.

11. The process according to claim 10, further comprising the step of forming a field on both of said mutually opposite surfaces, each field having a tunnel-shaped field pattern with tunnel axes transverse to said gas flow direction.

12. The process according to claim 10, wherein said field with said tunnel-shaped field pattern is closed in itself as considered in said sectional plane in which said gap appears as closed in itself is formed.

13. The process according to claim 10, wherein the magnetic field in the gap is shiftable during operation.

14. The process according to claim 1, wherein at least one of the mutually opposite surfaces is connected to electric DC, or to DC and superposed AC.

15. The process according to claim 1, wherein at least one workpiece is on floating potential or on a determined bias potential.

16. The process according to claim 15, wherein said workpiece is on a DC bias potential, or is on DC and superposed AC potential.

17. The process according to claim 1, wherein between the gap and the at least one workpiece, a pressure stage for the flow is provided.

18. The process according to claim 1, wherein the flow in the gap is implemented in the Knudsen or viscous range.

19. The process according to claim 18, wherein the flow in the gap is implemented in the Knudsen range.

20. The process according to claim 1, wherein the sputtering surfaces are arranged equidistant or such that the distance therebetween gradually narrows in said direction.

21. Sputter coating source comprising:
a gap closed in itself between two mutually opposite surfaces of a target arrangement, said mutually opposite surfaces being closed in themselves; an anode arrangement configured to generate a plasma discharge in said gap; and a gas feed arrangement feeding a gas into said gap to flow along and out of said gap in a direction essentially transverse to a sectional plane in which said gap appears as closed in itself, wherein said two mutually opposite surfaces of said target arrangement are the sputter surfaces of said target arrangement.

22. The source according to claim 21, wherein said gap in said direction has an extent which is considerably larger than an extent of surfaces of said target arrangement transverse to said direction.

23. The source according to claim 21, wherein the mutually opposite surfaces are each formed by one target and have terminals for an electric supply.

24. The source according to claim 21, wherein at least one of the mutually opposite surfaces is a metallic surface or a metallic compound surface.

25. The source according to claim 21, wherein at lest one of said mutually opposite surfaces is of one of Mg, MgO, InSn, ITO.

26. The source according to claim 21, wherein both said mutually opposite surfaces are of the same material.

27. The source according to claim 21, wherein at least one of the mutually opposite surfaces consist of ferromagnetic material.

28. The source according to claim 21, wherein at least one of the mutually opposite surfaces consists of Fe.

29. The source according to claim 21, wherein at least one of a permanent and of an electromagnet arrangement is arranged to provide a magnetic field in the gap.

30. The course according to claim 29, wherein across at least one of said mutually opposite surfaces the arrangement creates a tunnel field with a tunnel axis that progresses transversely to said direction.

31. The source according to claim 29, wherein across both of said mutually opposite surfaces, the arrangement creates a tunnel field with a tunnel axis that progresses transversely to said direction.

32. The source according to claim 29, wherein across at least one of said mutually opposite surfaces the arrangement creates a tunnel field which is closed in itself along said gap and as considered in said sectional plane.

33. The source according to claim 29, wherein the arrangement comprises magnets generating a field shiftable along said mutually opposite surfaces.

34. The source according to claim 21, wherein the gap is closed on one side and an anode arrangement is arranged in the area thereof.

35. The source according to claim 21, wherein an anode arrangement is provided between said two mutually opposite surfaces and adjacent to one end of said gap opposite to the end of said gap wherefrom said gas leaves said gap.

36. The source according to claim 21, wherein the gap opening is formed by a self-enclosed, closed loop slot orifice.

37. The source according to claim 21, wherein a width of said gap diminishes in the gas flow direction.

38. The source according to claim 21, wherein said gap forms a gas inlet nozzle for said gas towards a workpiece.

39. Sputter coating system, comprising at least one source which includes a gap closed in itself between two mutually opposite surfaces of a target arrangement, said mutually opposite surfaces being closed in themselves; an anode arrangement configured to generate a plasma discharge in said gap; and a gas feed arrangement feeding a gas into said gap to flow along and out of said gap in a direction essentially transverse to a sectional plane in which said gap appears as closed in itself, wherein said two mutually opposite surfaces of said target arrangement are the sputter surfaces of said target arrangement, the source being installed in a vacuum chamber, an additional gas exit arrangement is provided in the vacuum chamber and outside said gap.

40. The sputter coating system according to claim 39, wherein said additional gas exit arrangement is connected to a reservoir of reaction gas.

41. The system of claim 40, wherein said reaction gas contains $O_2$.

42. A process for manufacturing at least one workpiece coated with a material containing a ferromagnetic constituent, or with a dielectric material comprising the steps of using a sputter coating source with two mutually opposite sputtering surfaces, an anode arrangement configured to generate a plasma discharge between the two mutually opposite sputtering surfaces, and a gas exit arrangement effective between the gap defined between the sputtering surfaces, the sputtering surfaces each forming a surface that is closed in itself, the gap being a self-enclosed gap that is open on at least one side, and the gas exit arrangement of the gap opening being arranged at an opposite end thereof and towards the workplace.

43. The process according to claim 42, further comprising the step of coating said at least one workpiece with an MgO or ITO layer.

44. The process according to claim 42, further comprising the step of coating a plasma display panel.

45. The process according to claim 42, wherein the at least one workpiece is on a DC bias potential.

46. The process according to claim 42, wherein the at least one workpiece is on an electrical bias potential comprising DC and AC potential.

* * * * *